(12) United States Patent
Otsubo et al.

(10) Patent No.: US 12,495,485 B2
(45) Date of Patent: Dec. 9, 2025

(54) MODULE AND COMPONENT

(71) Applicant: Murata Manufacturing Co., Ltd., Nagaokakyo (JP)

(72) Inventors: Yoshihito Otsubo, Nagaokakyo (JP); Minoru Hatase, Nagaokakyo (JP)

(73) Assignee: MURATA MANUFACTURING CO., LTD., Kyoto-fu (JP)

( * ) Notice: Subject to any disclaimer, the term of this patent is extended or adjusted under 35 U.S.C. 154(b) by 253 days.

(21) Appl. No.: 18/060,007

(22) Filed: Nov. 30, 2022

(65) Prior Publication Data

US 2023/0119671 A1    Apr. 20, 2023

Related U.S. Application Data

(63) Continuation of application No. PCT/JP2021/020211, filed on May 27, 2021.

(30) Foreign Application Priority Data

Jun. 10, 2020  (JP) ................................. 2020-101185

(51) Int. Cl.
| | | |
|---|---|---|
| *H05K 9/00* | (2006.01) | |
| *H05K 1/02* | (2006.01) | |
| *H05K 1/18* | (2006.01) | |
| *H05K 3/28* | (2006.01) | |

(52) U.S. Cl.
CPC ............. *H05K 1/023* (2013.01); *H05K 1/181* (2013.01); *H05K 3/284* (2013.01); *H05K 9/0024* (2013.01)

(58) Field of Classification Search
CPC ........ H05K 1/023; H05K 1/181; H05K 3/284; H05K 9/0024
See application file for complete search history.

(56) References Cited

U.S. PATENT DOCUMENTS

| | | |
|---|---|---|
| 2004/0178500 A1 | 9/2004 | Usui |
| 2009/0002967 A1* | 1/2009 | Asami .................. H01L 23/552 |
| | | 257/E23.114 |
| 2010/0207264 A1 | 8/2010 | Ono |
| 2011/0006106 A1 | 1/2011 | Kanryo et al. |
| (Continued) | | |

FOREIGN PATENT DOCUMENTS

| | | |
|---|---|---|
| JP | 2004-297054 A | 10/2004 |
| JP | 4530110 B2 | 8/2010 |
| (Continued) | | |

OTHER PUBLICATIONS

International Search Report for PCT/JP2021/020211 dated Jul. 20, 2021.

*Primary Examiner* — Jacob R Crum
(74) *Attorney, Agent, or Firm* — McDonald Hopkins LLC

(57) ABSTRACT

A module includes: a substrate including a first surface and including first and second sides; a component as a first component mounted on the first surface; a first sealing resin arranged to cover the first surface and the first component; and a first shield film. An inclined portion is formed in the substrate. The substrate includes a first lead electrode arranged to be exposed to the inclined portion along the first side, and a second lead electrode arranged to be exposed to the inclined portion along the second side, and each of these is connected to the first shield film. A height of the second lead electrode is different from a height of the first lead electrode.

10 Claims, 17 Drawing Sheets

(56) References Cited

U.S. PATENT DOCUMENTS

| | | |
|---|---|---|
| 2011/0229708 A1 | 9/2011 | Asami et al. |
| 2012/0168214 A1 | 7/2012 | Kashiwagi et al. |
| 2017/0221835 A1 | 8/2017 | Yoo et al. |
| 2017/0256474 A1* | 9/2017 | Fujinaga ............. H01L 23/3121 |
| 2017/0323838 A1 | 11/2017 | Otsubo et al. |
| 2018/0108618 A1 | 4/2018 | Yamamoto et al. |
| 2018/0277457 A1* | 9/2018 | Endo ................... H05K 9/0009 |
| 2018/0286816 A1 | 10/2018 | Kitazaki et al. |
| 2020/0007174 A1 | 1/2020 | Watanabe |
| 2021/0204395 A1 | 7/2021 | Yamamoto et al. |

FOREIGN PATENT DOCUMENTS

| | | |
|---|---|---|
| JP | 2010-192653 A | 9/2010 |
| JP | 2011-216849 A | 10/2011 |
| JP | 2018-170419 A | 11/2018 |
| WO | 2011/040030 A1 | 4/2011 |
| WO | 2016/121491 A1 | 8/2016 |
| WO | 2016/204208 A1 | 12/2016 |
| WO | 2018/168653 A1 | 9/2018 |
| WO | 2020/067468 A1 | 4/2020 |

* cited by examiner

MODULE AND COMPONENT

CROSS REFERENCE TO RELATED APPLICATION

This is a continuation of International Application No. PCT/JP2021/020211 filed on May 27, 2021 which claims priority from Japanese Patent Application No. 2020-101185 filed on Jun. 10, 2020. The contents of these applications are incorporated herein by reference in their entireties.

BACKGROUND OF THE DISCLOSURE

Field of the Disclosure

The present disclosure relates to a module and a component.

Description of the Related Art

One example of a method for manufacturing a module is described in Japanese Patent No. 4530110 (PTL 1). In PTL 1, in order to produce a plurality of modules, components are mounted on a surface of a substrate in a state of a collective substrate corresponding to the plurality of modules, and then, a resin sealing layer is formed, and then, the substrate is cut into pieces of a size of an individual product. In this case, the entire thickness of the substrate is not cut at a time, but the entire thickness of the substrate may be cut only halfway. A shield film is formed in this state, and then, the collective substrate is completely cut into pieces of a size of an individual module.

PTL 1: Japanese Patent No. 4530110

BRIEF SUMMARY OF THE DISCLOSURE

In the manufacturing method described in PTL 1, the substrate is cut halfway, and thus, a ground electrode can be exposed and connected to the subsequently-provided shield film, thereby ensuring the shielding property of the module. A step is formed to surround an outer perimeter of the module, and the shield film is formed to cover the step. The ground electrode provided to ground the shield film may be exposed to the vicinity of the step.

The number of the ground electrode for establishing electrical connection with the shield film on a side surface of the substrate is not limited to one and there may be a plurality of ground electrodes. The plurality of ground electrodes may be arranged at different depths, depending on locations in one module. When the step is formed to completely surround the outer perimeter of the module as shown in PTL 1, it is uncertain which part of a module side surface each of the ground electrodes arranged at different depths is connected to. When the sealing resin layer and the side surface of the substrate are perpendicular to each other, the shield film formed by sputtering tends to become thinner toward the lower side, and thus, connection between each ground electrode exposed to the side surface of the substrate and the shield film may become insufficient, depending on the situation.

Accordingly, a possible benefit of the present disclosure is to provide a module and a component that can achieve sufficient and stable electrical connection between a ground electrode and a shield film.

In order to attain the above-described benefit, a module based on the present disclosure includes: a substrate including a first surface and including first and second sides; a first component mounted on the first surface; a first sealing resin arranged to cover the first surface and the first component; and a first shield film that covers upper and side surfaces of the first sealing resin and at least a part of a side surface of the substrate. When viewed in a cross section taken along a plane perpendicular to the first surface, an inclined portion is formed in the substrate. The substrate includes a first lead electrode arranged to be exposed to the inclined portion along the first side, and a second lead electrode arranged to be exposed to the inclined portion along the second side. Each of the first lead electrode and the second lead electrode is connected to the first shield film. A position of the second lead electrode in a height direction is different from a position of the first lead electrode in the height direction.

According to the present disclosure, even when the positions of the lead electrodes as ground electrodes are different, the lead electrodes and the shield film can be connected at the inclined portion, i.e., the thickened portion of the shield film. Therefore, sufficient and stable electrical connection between each ground electrode exposed to the side surface of the substrate and the shield film can be achieved.

DETAILED DESCRIPTION OF THE DISCLOSURE

The dimension ratio shown in each of the figures does not always faithfully show the actual dimension ratio, but may show the dimension ratio in an exaggerated manner for the sake of explanation. In the following description, mentioning the concept of "upper" or "lower" does not necessarily indicate an absolute upper or lower position, but may indicate a relatively upper or lower position in the posture shown in each figure.

First Embodiment

Figure 1:
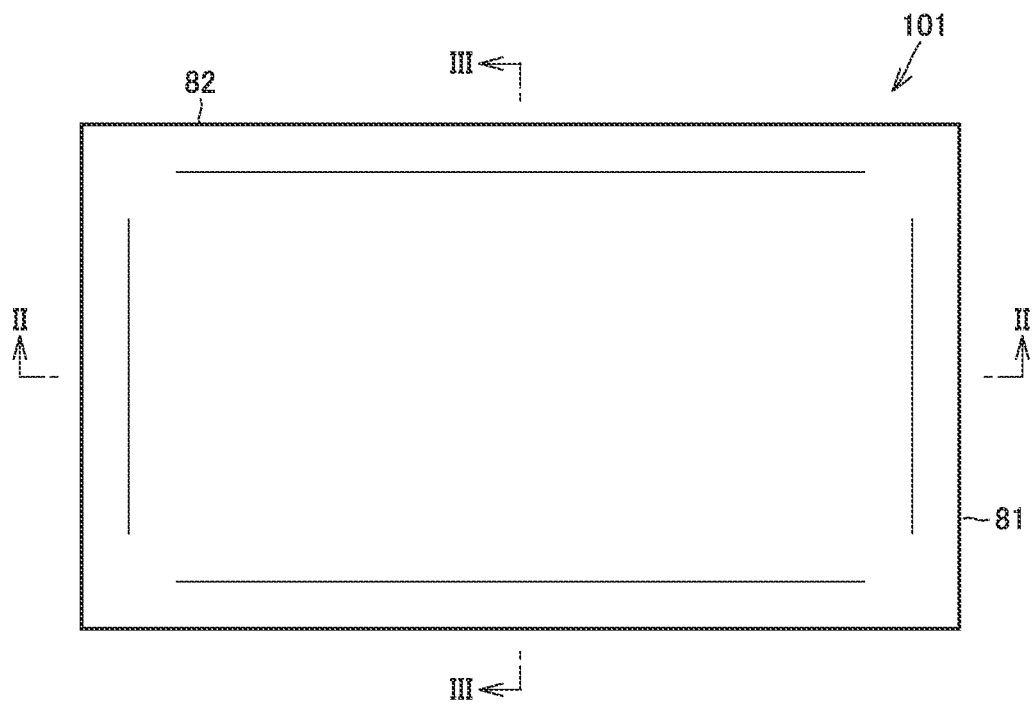
FIG. 1 is a plan view of a module according to a first embodiment based on the present disclosure.
Figure 2:
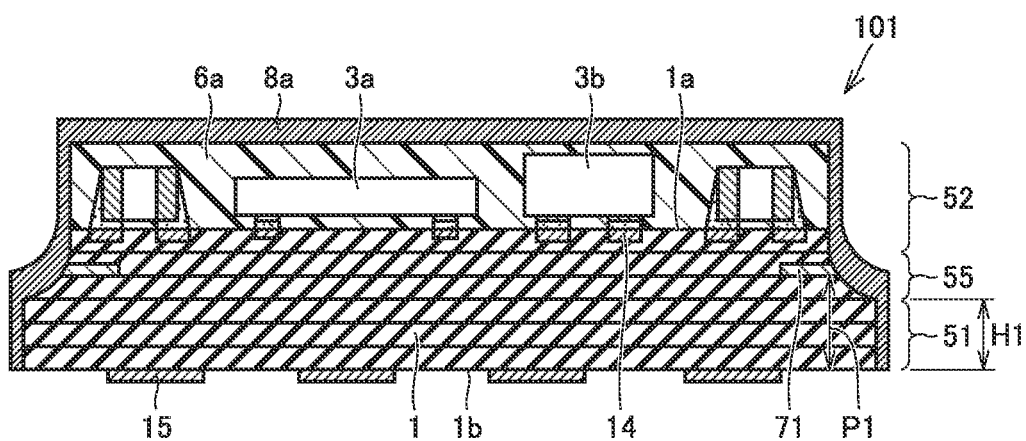
FIG. 2 is a cross-sectional view taken along the line II-II in FIG. 1.
Figure 3:
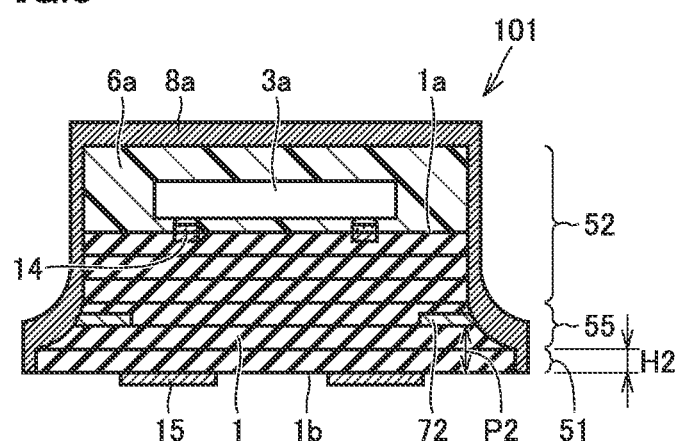
FIG. 3 is a cross-sectional view taken along the line III-III in FIG. 1.

A module according to a first embodiment based on the present disclosure will be described with reference to FIGS. 1 to 3. FIG. 1 shows a plan view of a module 101 according to the present embodiment. A right-hand side in FIG. 1 corresponds to a first side 81, and an upper side corresponds to a second side 82. FIG. 2 shows a cross-sectional view taken along the line II-II in FIG. 1. FIG. 3 shows a cross-sectional view taken along the line III-III in FIG. 1.

Module 101 includes: a substrate 1 including a first surface 1a and including first side 81 and second side 82 in a plan view; a component 3a as a first component mounted on first surface 1a; a first sealing resin 6a arranged to cover first surface 1a and the first component; and a first shield film 8a that covers upper and side surfaces of first sealing resin 6a and at least a part of a side surface of substrate 1. Although several components are mounted on first surface 1a in addition to component 3a, component 3a is described as the first component. A component 3b is also mounted on first surface 1a, for example. In the figures, the reference characters are not necessarily assigned to all of the mounted components. In the example shown here, several components having no reference characters are also mounted on first surface 1a, for example.

Substrate 1 includes a second surface 1b as a surface opposite to first surface 1a. A pad electrode 15 is arranged on second surface 1b. Pad electrode 15 functions as an external connection terminal and is used when mounting module 101 on a mother substrate or the like. A pad electrode 14 is arranged on first surface 1a, and component 3a and the like are electrically connected to substrate 1 by using pad electrode 14.

When viewed in a cross section taken along a plane perpendicular to first surface 1a, i.e., when viewed in FIG. 2 or 3, a side surface of a combined portion of first sealing resin 6a and substrate 1 includes a first portion 51 that exists as a part of the side surface of substrate 1, a second portion 52 that includes the side surface of first sealing resin 6a and is recessed from first portion 51, and an inclined portion 55 that connects first portion 51 and second portion 52. That is, when viewed in the cross section taken along the plane perpendicular to first surface 1a, inclined portion 55 is formed in substrate 1. In the example shown here, inclined portion 55 has a so-called R shape. A combination of first portion 51, second portion 52 and inclined portion 55 exists uniquely along each of first side 81 and second side 82.

Substrate 1 includes a first lead electrode 71 arranged to be exposed to inclined portion 55 along first side 81 (see FIG. 2), and a second lead electrode 72 arranged to be exposed to inclined portion 55 along second side 82 (see FIG. 3). Each of first lead electrode 71 and second lead electrode 72 is connected to first shield film 8a. A position of second lead electrode 72 in a height direction is different from a position of first lead electrode 71 in the height direction. That is, the position of first lead electrode 71 in the height direction is a position having a height P1 relative to second surface 1b of substrate 1, while the position of second lead electrode 72 in the height direction is a position having a height P2 relative to second surface 1b of substrate 1. P1 and P2 are different from each other.

In addition, a position of inclined portion 55 in the height direction along second side 82 is different from a position of inclined portion 55 in the height direction along first side 81. The position of inclined portion 55 in the height direction along first side 81 is a position having a height H1 relative to second surface 1b of substrate 1 (see FIG. 2), while a position of inclined portion 55 in the height direction along second side 82 is a position having a height H2 relative to second surface 1b of substrate 1 (see FIG. 3). H1 and H2 are different from each other. The position of inclined portion 55 in the height direction along each of first side 81 and second side 82 is set in accordance with the position of each of first lead electrode 71 and second lead electrode 72 in the height direction. That is, the reason why the position of inclined portion 55 in the height direction along first side 81 is different from the position of inclined portion 55 in the height direction along second side 82 is that the position of first lead electrode 71 in the height direction is different from the position of second lead electrode 72 in the height direction.

Generally, the shield film is formed by sputtering. Therefore, first shield film 8a may thickly adhere to inclined portion 55. In the present embodiment, first lead electrode 71 is arranged to be exposed to inclined portion 55 along first side 81, and thus, connection between first lead electrode 71 and first shield film 8a can be made at the thickened portion of first shield film 8a. In addition, second lead electrode 72 located at the position in the height direction different from that of first lead electrode 71 is also arranged to be exposed to inclined portion 55 along second side 82, and thus, connection between second lead electrode 72 and first shield film 8a can be made at the thickened portion of first shield film 8a. Therefore, even when the positions, in the height direction, of the lead electrodes exposed to the side surfaces of the substrate are different, sufficient and stable electrical connection between the lead electrodes, i.e., ground electrodes and first shield film 8a as the shield film can be achieved. In this way, the shielding performance can be enhanced.

In the present embodiment, first side 81 and second side 82 are perpendicular to each other in a plan view. That is, first side 81 and second side 82 are perpendicular to each other in FIG. 1. Such a configuration may be applied.

In the present embodiment, when viewed in the above-described cross section, inclined portion 55 has a downward convex curved shape. By applying this configuration, first shield film 8a in inclined portion 55 can be made thicker. In the present embodiment, when viewed in the above-described cross section, inclined portion 55 and second portion 52 are continuous to each other.

(Manufacturing Method)

Figure 4:
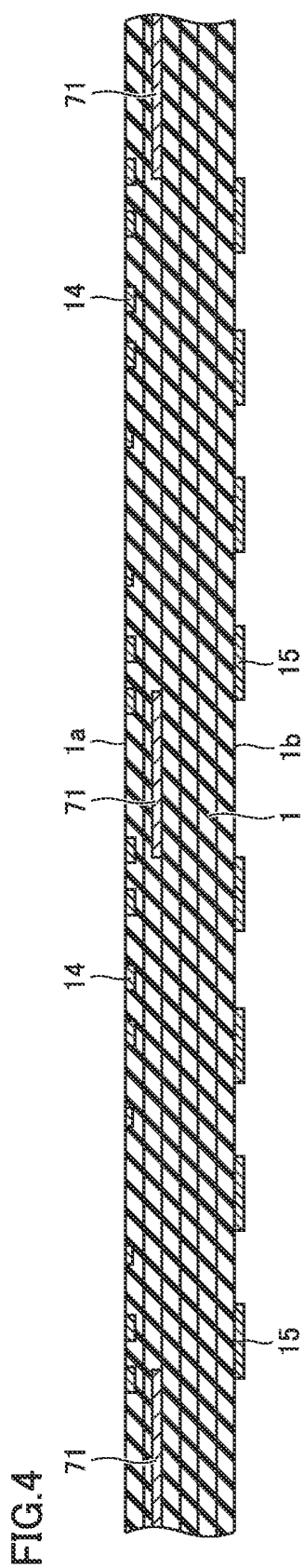
FIG. 4 is an illustrative view of a first step in a method for manufacturing the module according to the first embodiment based on the present disclosure.

A method for manufacturing module 101 will be described with reference to FIGS. 4 to 8. First, substrate 1 as shown in FIG. 4 is prepared. At this point, substrate 1 is a collective substrate. That is, substrate 1 has a large area corresponding to a plurality of modules 101. Substrate 1 includes first surface 1a and second surface 1b. Pad electrode 14 is arranged on first surface 1a. Pad electrode 15 is arranged on second surface 1b.

Figure 5:
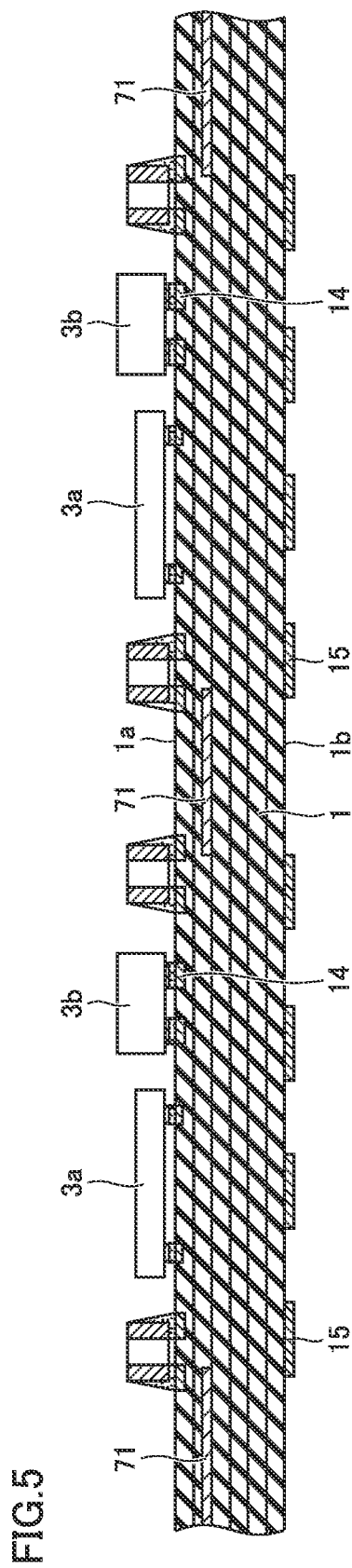
FIG. 5 is an illustrative view of a second step in the method for manufacturing the module according to the first embodiment based on the present disclosure.
Figure 6:
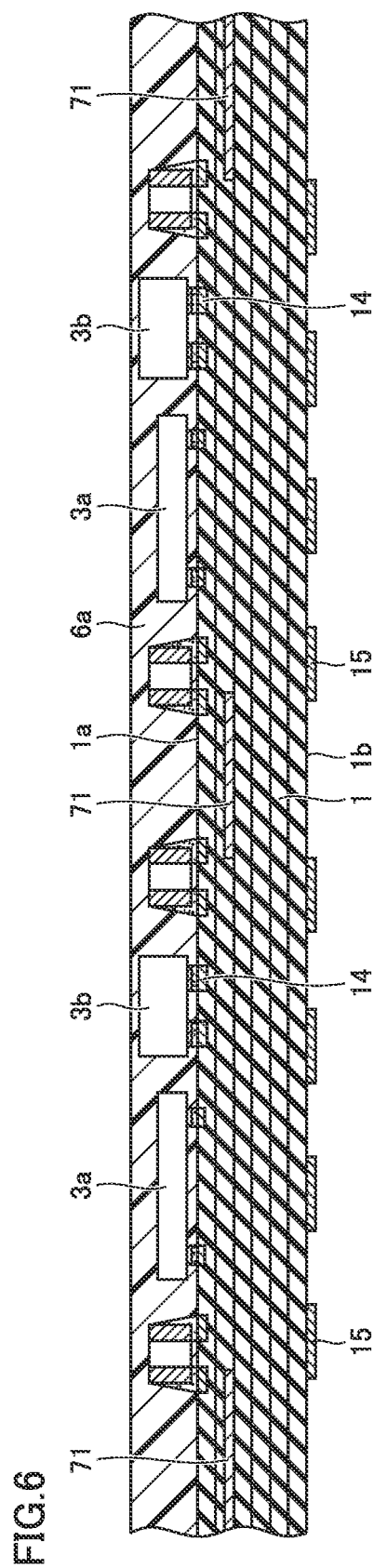
FIG. 6 is an illustrative view of a third step in the method for manufacturing the module according to the first embodiment based on the present disclosure.

As shown in FIG. 5, the components are mounted on first surface 1a. Here, components 3a, 3b and the like are mounted. Next, as shown in FIG. 6, first sealing resin 6a is arranged. First sealing resin 6a is formed by molding.

Figure 7:
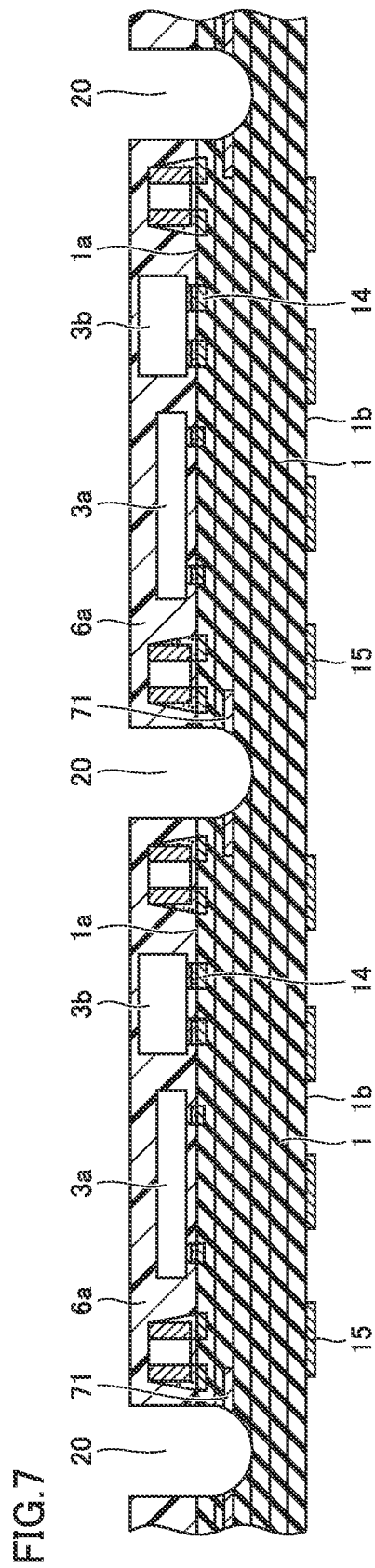
FIG. 7 is an illustrative view of a fourth step in the method for manufacturing the module according to the first embodiment based on the present disclosure.

As shown in FIG. 7, a groove 20 is formed along a boundary line of each module. Groove 20 can be formed by using a dicing machine. Groove 20 is formed to completely split first sealing resin 6a and cut substrate 1 halfway in a thickness direction. Such formation of groove 20 is also called "half cut". At this time, an inclined portion is formed on an inner surface of the groove, based on the shape of a dicing blade. Groove 20 is formed such that the lead electrode in substrate 1 is exposed to this inclined portion.

Figure 8:
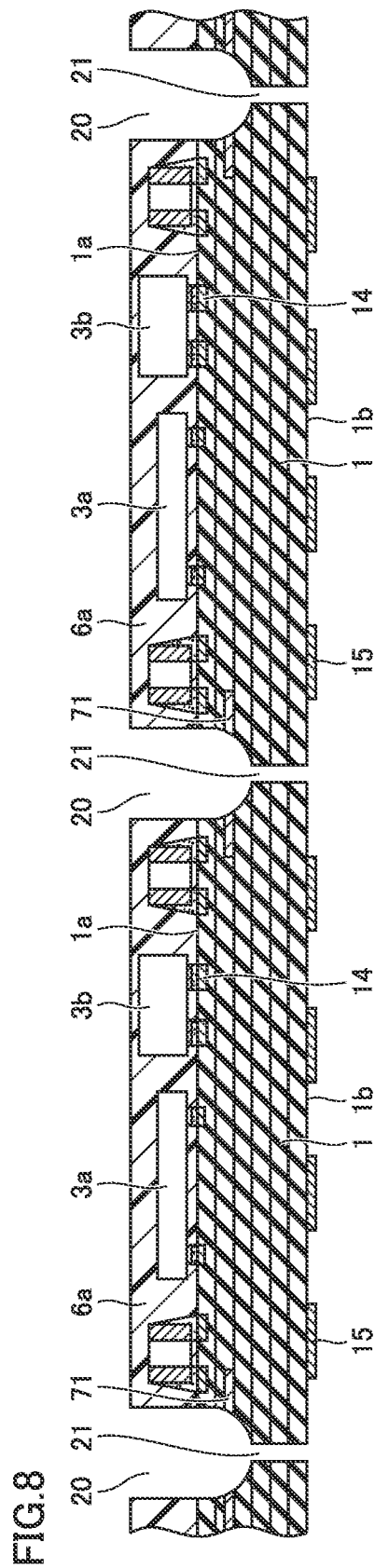
FIG. 8 is an illustrative view of a fifth step in the method for manufacturing the module according to the first embodiment based on the present disclosure.

Furthermore, as shown in FIG. 8, the collective substrate is cut into pieces of a size of an individual module by using the dicing machine. That is, a break 21 is formed. A blade used when forming break 21 is thinner than a blade used when forming groove 20. The pieces of a size of an individual module as described above are subjected to sputtering, to thereby form first shield film 8a. Module 101 shown in FIGS. 1 to 3 can be thus obtained.

Second Embodiment

Figure 9:
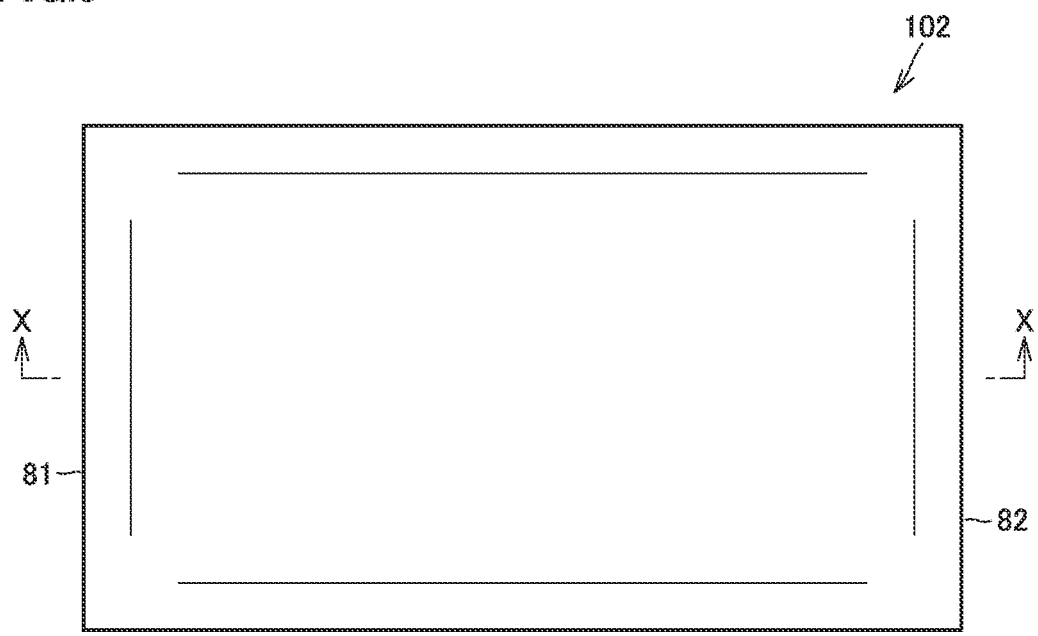
FIG. 9 is a plan view of a module according to a second embodiment based on the present disclosure.
Figure 10:
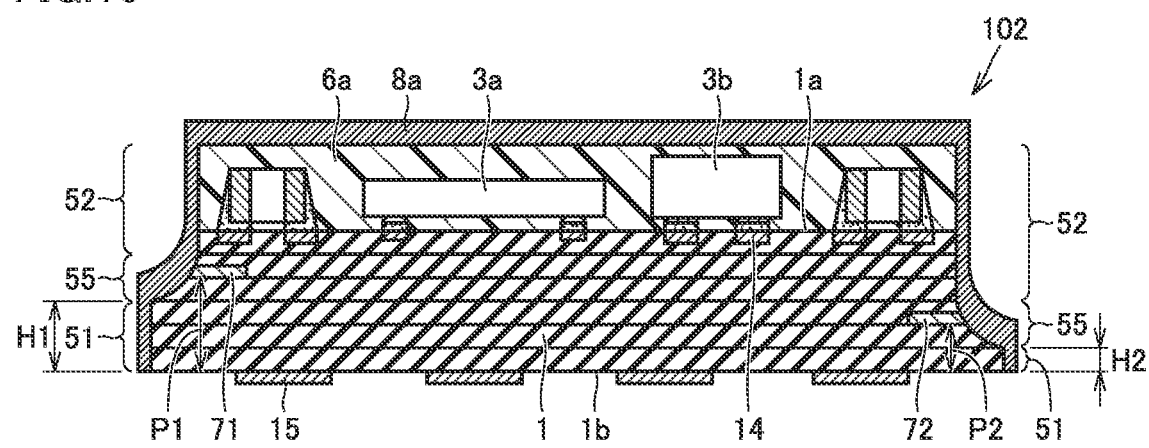
FIG. 10 is a cross-sectional view taken along the line X-X in FIG. 9.

A module according to a second embodiment based on the present disclosure will be described with reference to FIGS. 9 to 10. FIG. 9 shows a plan view of a module 102 according to the present embodiment. A left-hand side in FIG. 9 corresponds to first side 81, and a right-hand side corresponds to second side 82. FIG. 10 shows a cross-sectional view taken along the line X-X in FIG. 9.

The present embodiment is different from the first embodiment in terms of a positional relationship between first side 81 and second side 82. In the present embodiment, first side 81 and second side 82 face each other. In the example shown here, first side 81 and second side 82 are parallel to each other.

The present embodiment can also provide the effect described in the first embodiment.

Third Embodiment

Figure 11:
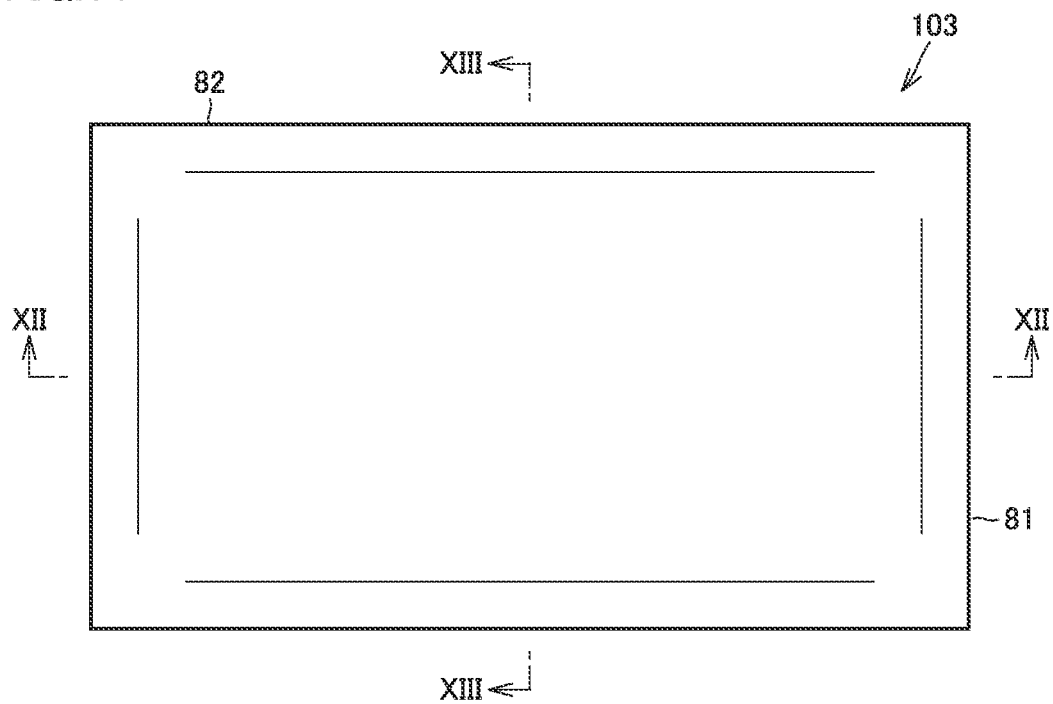
FIG. 11 is a plan view of a module according to a third embodiment based on the present disclosure.
Figure 12:
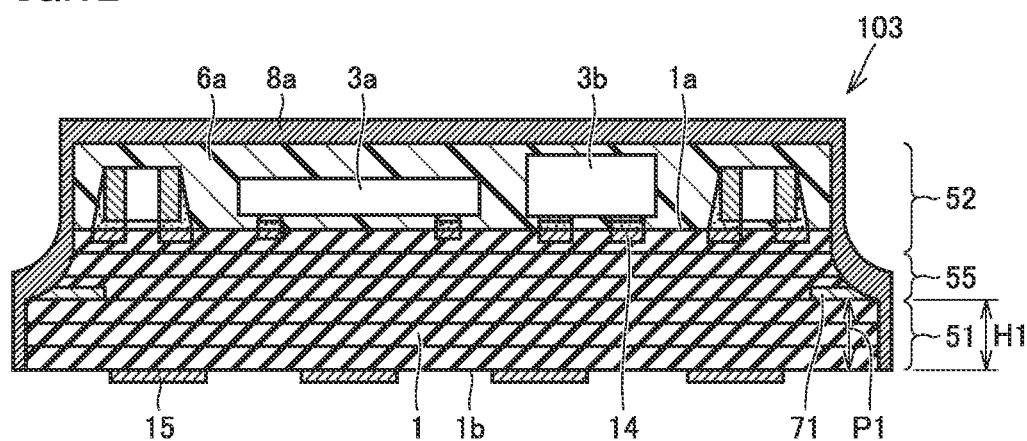
FIG. 12 is a cross-sectional view taken along the line XII-XII in FIG. 11.
Figure 13:
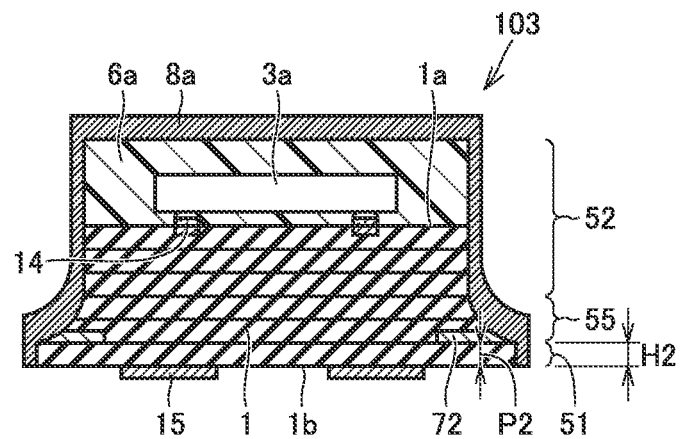
FIG. 13 is a cross-sectional view taken along the line XIII-XIII in FIG. 11.

A module according to a third embodiment based on the present disclosure will be described with reference to FIGS. 11 to 13. FIG. 11 shows a plan view of a module 103 according to the present embodiment. A right-hand side in FIG. 11 corresponds to first side 81, and an upper side corresponds to second side 82. FIG. 12 shows a cross-sectional view taken along the line XII-XII in FIG. 11. FIG. 13 shows a cross-sectional view taken along the line XIII-XIII in FIG. 11.

In the present embodiment, at least one of first lead electrode 71 and second lead electrode 72 is exposed to a lower end of inclined portion 55. In the present embodiment, first lead electrode 71 is exposed to the lower end of inclined portion 55 along first side 81 as shown in FIG. 12, and second lead electrode 72 is exposed to the lower end of inclined portion 55 along second side 82 as shown in FIG. 13.

In the present embodiment, the lead electrodes are exposed to the locations having a particularly large area of contact with first shield film 8a, and thus, more stable electrical connection between the lead electrodes and first shield film 8a can be achieved.

Fourth Embodiment

Figure 14:
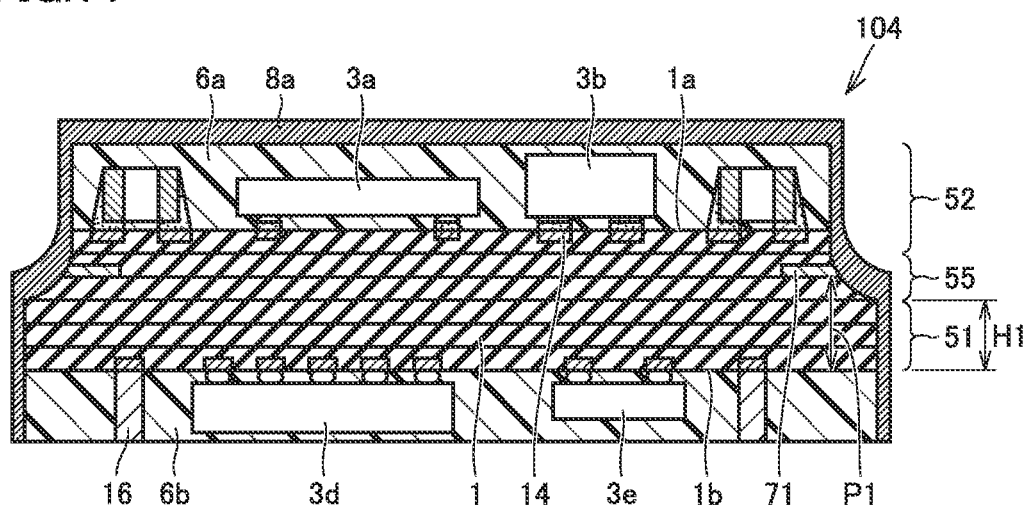
FIG. 14 is a cross-sectional view of a module according to a fourth embodiment based on the present disclosure.

A module according to a fourth embodiment based on the present disclosure will be described with reference to FIG. 14. FIG. 14 shows a cross-sectional view of a module 104 according to the present embodiment.

Module 104 includes a double-sided mounting structure. In module 104, substrate 1 includes second surface 1b as a surface opposite to first surface 1a. A component 3d is mounted on second surface 1b as a second component. Although component 3d is described as the second component in the example shown here, this is merely one example. In addition to component 3d, several components such as a component 3e may be mounted on second surface 1b.

In the present embodiment, a second sealing resin 6b arranged to cover second surface 1b and component 3d as the second component is provided. First shield film 8a further covers a side surface of second sealing resin 6b.

The present embodiment can also provide the effect described in the first embodiment. In the present embodiment, because of the double-sided mounting structure, more components can be mounted on substrate 1 having a limited area.

The surface(s) of one or all of components 3d and 3e may be exposed from second sealing resin 6b.

Fifth Embodiment

Figure 15:
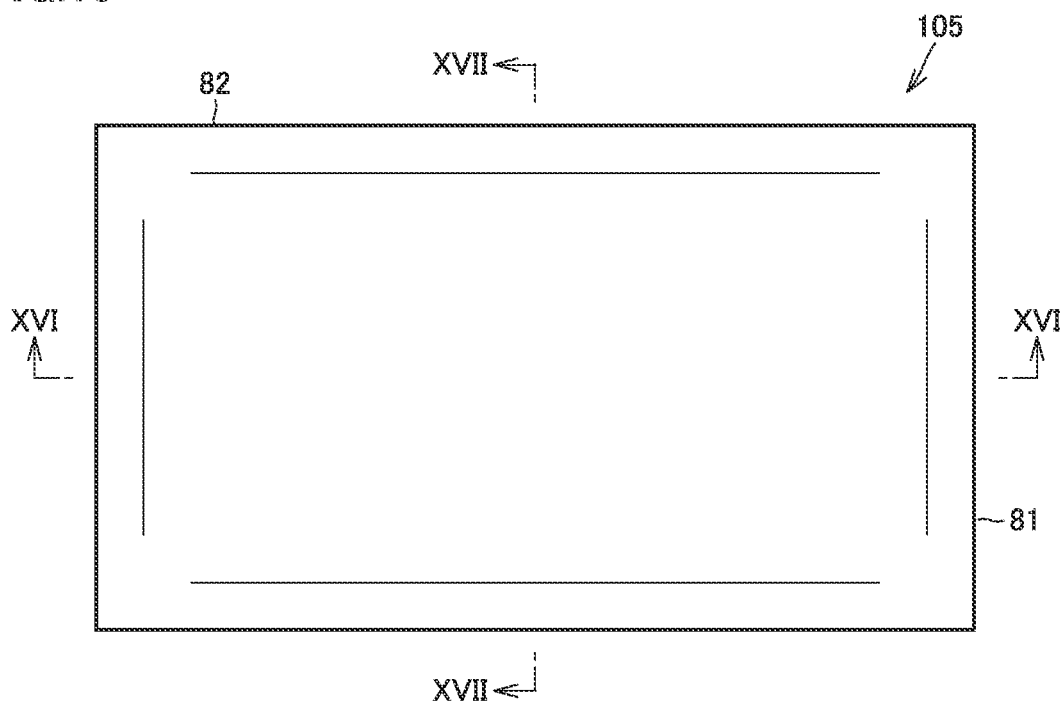
FIG. 15 is a plan view of a module according to a fifth embodiment based on the present disclosure.
Figure 16:
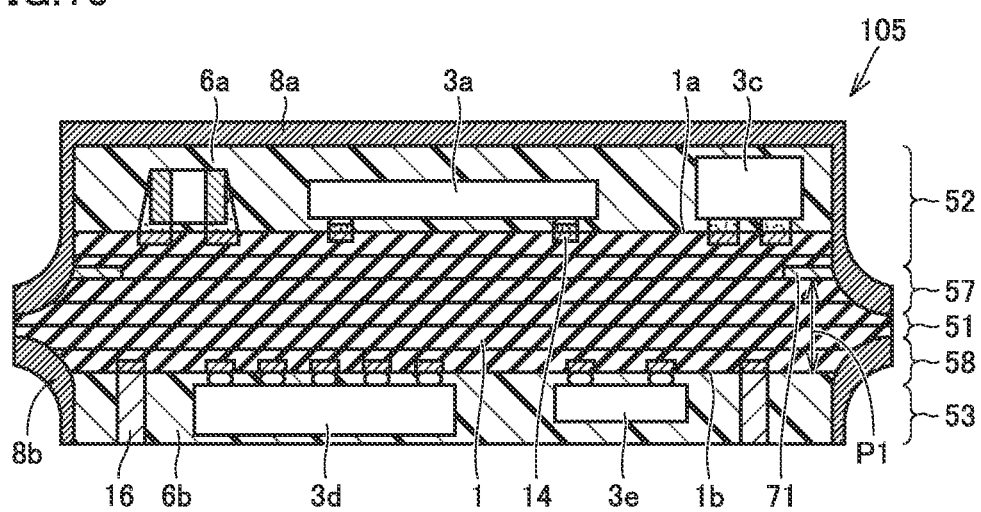
FIG. 16 is a cross-sectional view taken along the line XVI-XVI in FIG. 15.
Figure 17:
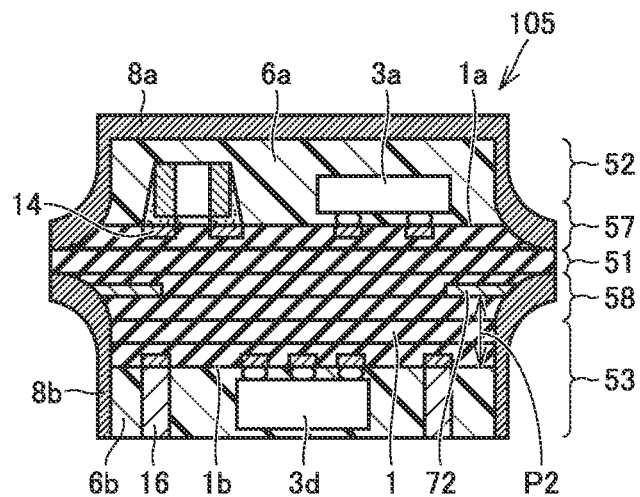
FIG. 17 is a cross-sectional view taken along the line XVII-XVII in FIG. 15.

A module according to a fifth embodiment based on the present disclosure will be described with reference to FIGS. 15 to 17. FIG. 15 shows a plan view of a module 105 according to the present embodiment. A right-hand side in FIG. 15 corresponds to first side 81, and an upper side corresponds to second side 82. FIG. 16 shows a cross-sectional view taken along the line XVI-XVI in FIG. 15. FIG. 17 shows a cross-sectional view taken along the line XVII-XVII in FIG. 15. Module 105 includes a first inclined portion 57 and a second inclined portion 58.

Module 105 includes: substrate 1 including first surface 1a and second surface 1b that faces opposite to first surface 1a, and including first side 81 and second side 82 in a plan view; component 3a as a first component mounted on first surface 1a; first sealing resin 6a arranged to cover first surface 1a and the first component; first shield film 8a that covers upper and side surfaces of first sealing resin 6a and a part of a side surface of substrate 1; second sealing resin 6b arranged to cover second surface 1b; and a second shield film 8b that covers another part of the side surface of substrate 1. When viewed in a cross section taken along a plane perpendicular to first surface 1a, a side surface of a combined portion of first sealing resin 6a, substrate 1 and second sealing resin 6b includes first portion 51 that exists as a part of the side surface of substrate 1, second portion 52 that includes the side surface of first sealing resin 6a and is recessed from first portion 51, first inclined portion 57 that connects first portion 51 and second portion 52, a third portion 53 that includes a side surface of second sealing resin 6b and is recessed from first portion 51, and second inclined portion 58 that connects first portion 51 and third portion 53.

Substrate 1 includes first lead electrode 71 arranged to be exposed to first inclined portion 57 along first side 81, and second lead electrode 72 arranged to be exposed to second inclined portion 58 along second side 82.

First shield film 8a covers second portion 52 and first inclined portion 57. First lead electrode 71 is connected to first shield film 8a. Second shield film 8b covers third portion 53 and second inclined portion 58. Second lead electrode 72 is connected to second shield film 8b. A position of second lead electrode 72 in a height direction is different from a position of first lead electrode 71 in the height direction. That is, the position of first lead electrode 71 in the height direction is a position having height P1 relative to second surface 1b of substrate 1, while the position of second lead electrode 72 in the height direction is a position having height P2 relative to second surface 1b of substrate 1. P1 and P2 are different from each other.

In addition, as is clear from FIGS. 16 and 17, a position, in the height direction, of first portion 51 that exists as a part of the side surface of substrate 1 is different between first side 81 and second side 82 of substrate 1. Thus, on each of the front side and the back side of substrate 1 of the module including a double-sided mounting structure, connection between the lead electrodes as ground electrodes and the shield films can be made at the thickened portion of the shield films. As a result, the degree of freedom in design can be improved.

The present embodiment can also provide the effect described in the first embodiment.

In the present embodiment, first shield film 8a and second shield film 8b are spaced apart from each other. When electrical separation between first shield film 8a and second shield film 8b is desired, this configuration is preferable. However, when it is required to ground first shield film 8a and second shield film 8b in the same manner, first shield film 8a and second shield film 8b may be formed to be continuous to each other without being spaced apart from each other.

In the present embodiment, first side 81 and second side 82 are perpendicular to each other in a plan view. Such a configuration may be applied.

Alternatively, first side 81 and second side 82 may face each other. For example, first side 81 and second side 82 may be parallel to each other.

Sixth Embodiment

Figure 18:
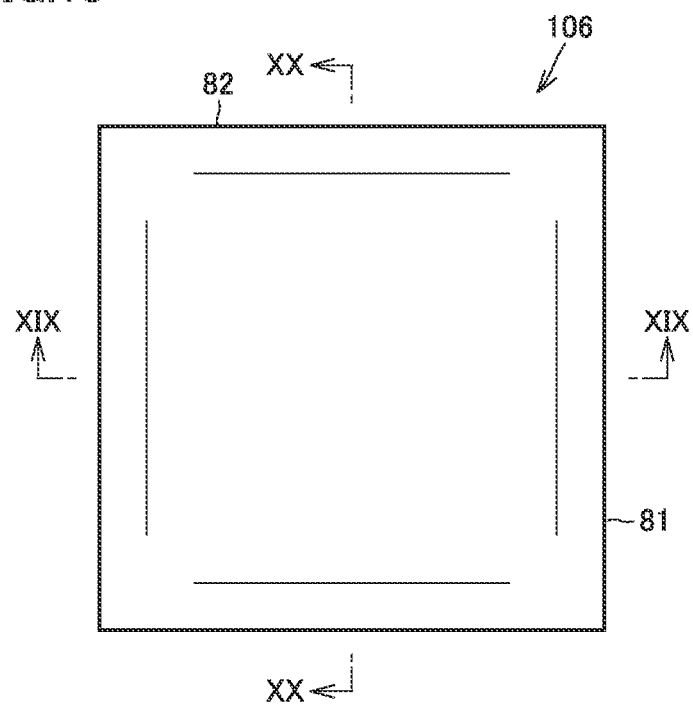
FIG. 18 is a plan view of a component according to a sixth embodiment based on the present disclosure.
Figure 19:
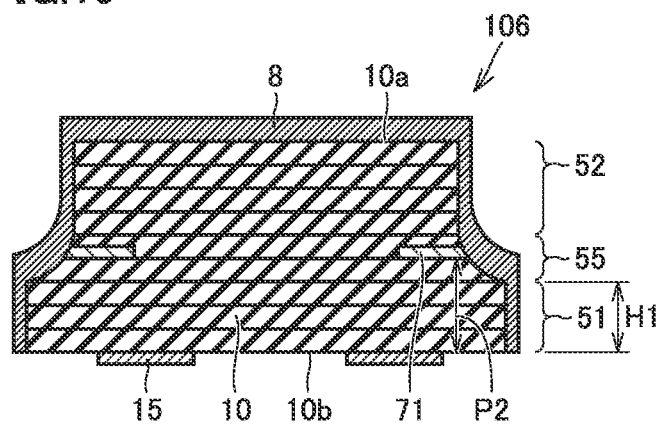
FIG. 19 is a cross-sectional view taken along the line XIX-XIX in FIG. 18.
Figure 20:
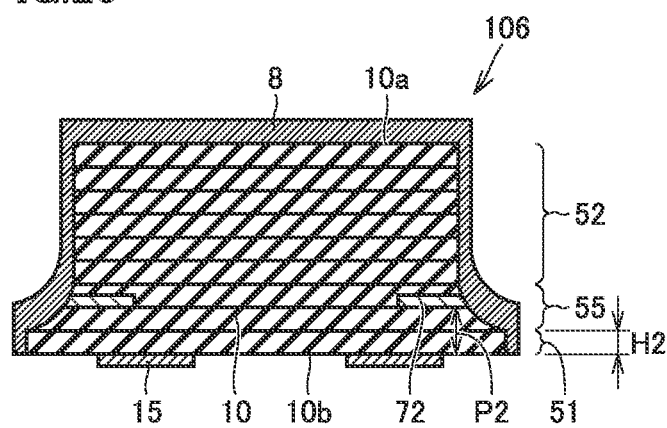
FIG. 20 is a cross-sectional view taken along the line XX-XX in FIG. 18.

A component according to a sixth embodiment based on the present disclosure will be described with reference to FIGS. 18 to 20. FIG. 18 shows a plan view of a component 106 according to the present embodiment. A right-hand side in FIG. 18 corresponds to first side 81, and an upper side corresponds to second side 82. FIG. 19 shows a cross-sectional view taken along the line XIX-XIX in FIG. 18. FIG. 20 shows a cross-sectional view taken along the line XX-XX in FIG. 18.

Component 106 is, for example, an electronic component. Component 106 may be, for example, an LC component.

Component 106 includes: a base member 10 including a first surface 10a and including first side 81 and second side 82 in a plan view; and a shield film 8 that covers at least a side surface of base member 10. When viewed in a cross section taken along a plane perpendicular to first surface 10a, the side surface of base member 10 includes first portion 51 that reaches a lower end of base member 10, second portion 52 that reaches an upper end of base member 10 and is recessed from first portion 51, and inclined portion 55 that connects first portion 51 and second portion 52. Base member 10 includes first lead electrode 71 arranged to be exposed to inclined portion 55 along first side 81, and second lead electrode 72 arranged to be exposed to inclined portion 55 along second side 82. Each of first lead electrode 71 and second lead electrode 72 is connected to shield film 8. A position of second lead electrode 72 in a height direction is different from a position of first lead electrode 71 in the height direction. A position of inclined portion 55 in the height direction along second side 82 is different from a position of inclined portion 55 in the height direction along first side 81. That is, the position of first lead electrode 71 in the height direction is a position having height P1 relative to a second surface 10b of base member 10, while a position of second lead electrode 72 in the height direction is a position having height P2 relative to second surface 10b of base member 10. P1 and P2 are different from each other. The position of inclined portion 55 in the height direction along first side 81 is a position having height H1 relative to second surface 10b of base member 10, while the position of inclined portion 55 in the height direction along second side 82 is a position having height H2 relative to second surface 10b of base member 10. H1 and H2 are different from each other.

In the present embodiment, first lead electrode 71 is arranged to be exposed to inclined portion 55 along first side 81, and thus, connection between first lead electrode 71 and first shield film 8a can be made at the thickened portion of first shield film 8a. Therefore, sufficient electrical connection between first lead electrode 71 and first shield film 8a can be achieved and the shielding performance can be enhanced.

Seventh Embodiment

Figure 21:
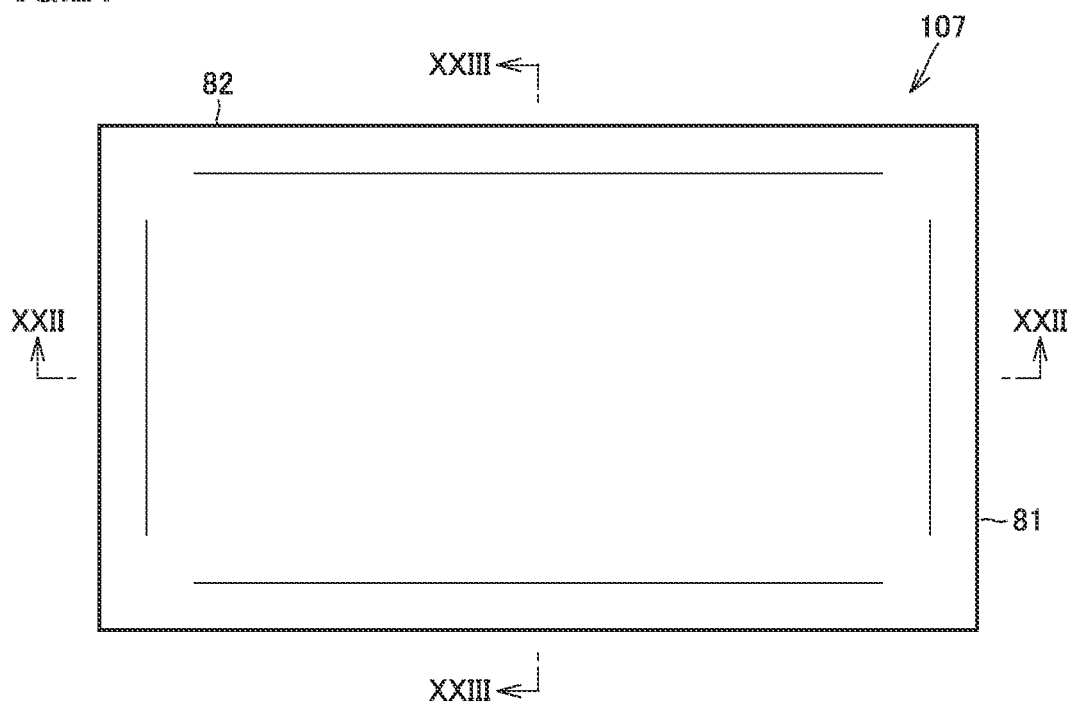
FIG. 21 is a plan view of a module according to a seventh embodiment based on the present disclosure.
Figure 22:
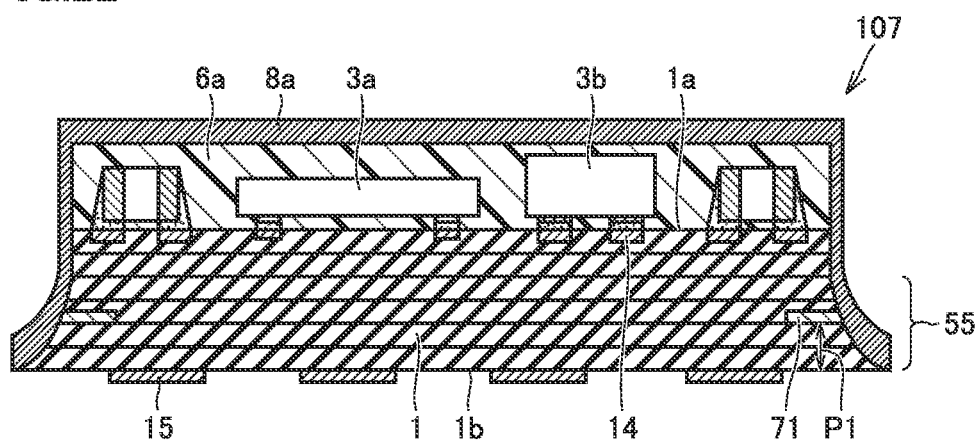
FIG. 22 is a cross-sectional view taken along the line XXII-XXII in FIG. 21.
Figure 23:
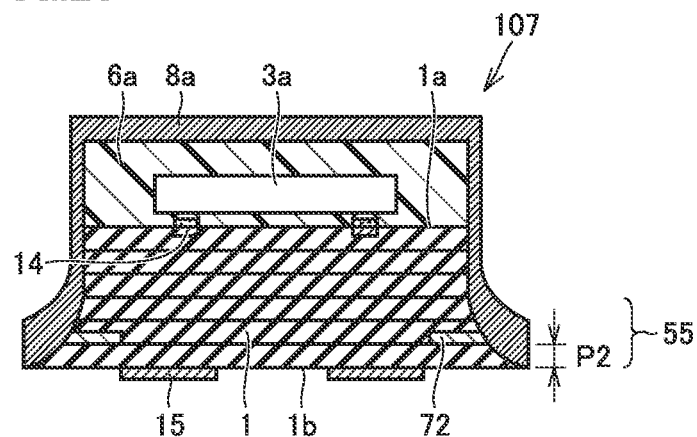
FIG. 23 is a cross-sectional view taken along the line XXIII-XXIII in FIG. 21.

A component according to a seventh embodiment based on the present disclosure will be described with reference to FIGS. 21 to 23. FIG. 21 shows a plan view of a module 107 according to the present embodiment. A right-hand side in FIG. 21 corresponds to first side 81, and an upper side corresponds to second side 82. FIG. 22 shows a cross-sectional view taken along the line XXII-XXII in FIG. 21. FIG. 23 shows a cross-sectional view taken along the line XXIII-XXIII in FIG. 21.

When viewed in a cross section taken along a plane perpendicular to first surface 1a, i.e., when viewed in FIG. 22 or 23, inclined portion 55 is formed on a side surface of substrate 1. In the present embodiment, as shown in FIG. 22, inclined portion 55 is formed at a lower end of the side surface of substrate 1 along first side 81. As shown in FIG. 23, inclined portion 55 is also formed at the lower end of the side surface of substrate 1 along second side 82. In the present embodiment, first lead electrode 71 and second lead electrode 72 are exposed to inclined portion 55.

The present embodiment can also provide the effect described in the first embodiment. That is, first shield film 8a in inclined portion 55 can be made thicker. Therefore, sufficient and stable electrical connection between the ground electrodes and the shield film can be achieved.

Eighth Embodiment

Figure 24:
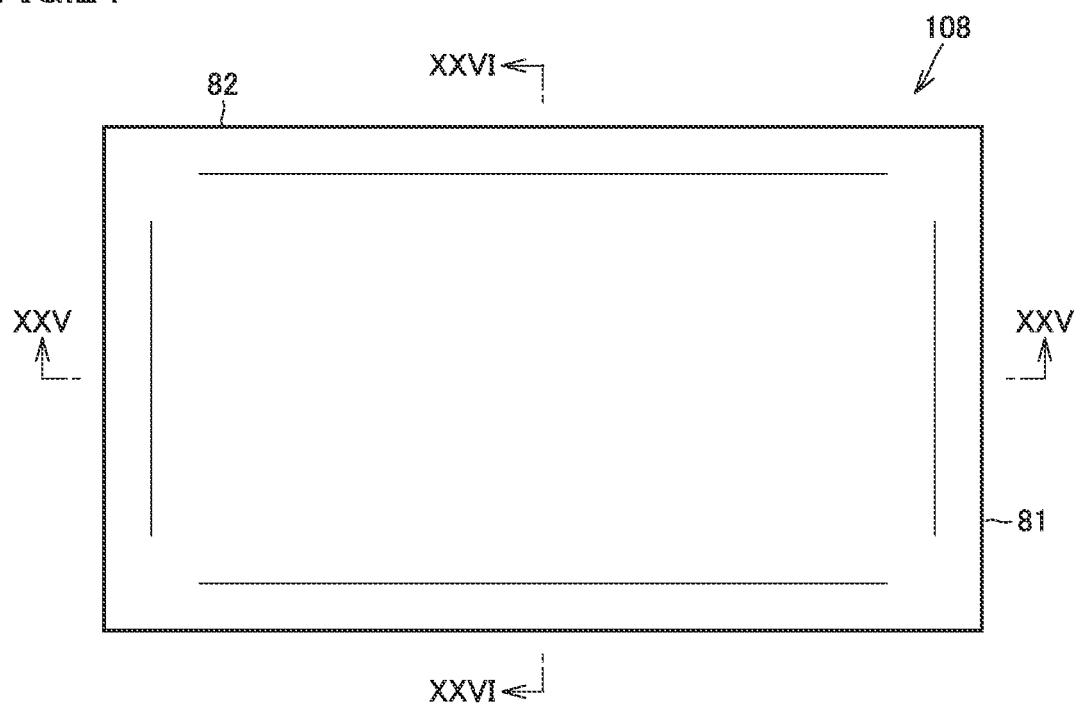
FIG. 24 is a plan view of a module according to an eighth embodiment based on the present disclosure.
Figure 25:
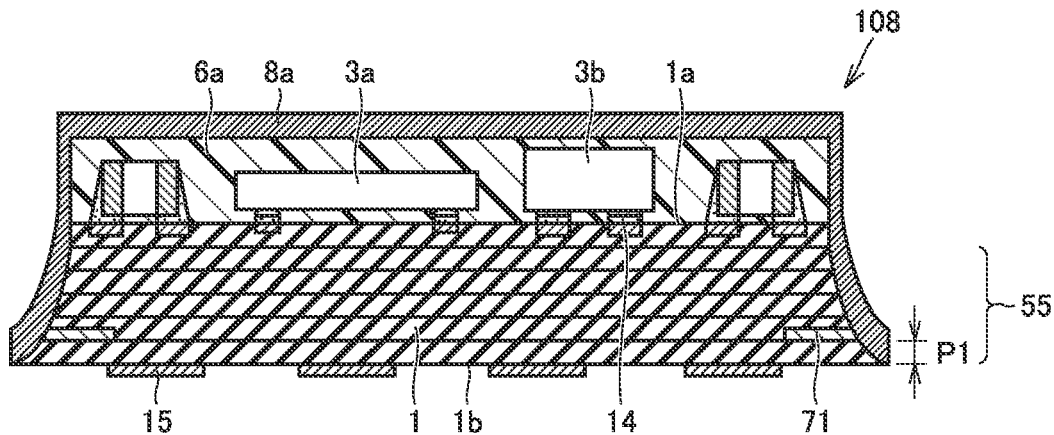
FIG. 25 is a cross-sectional view taken along the line XXV-XXV in FIG. 24.
Figure 26:
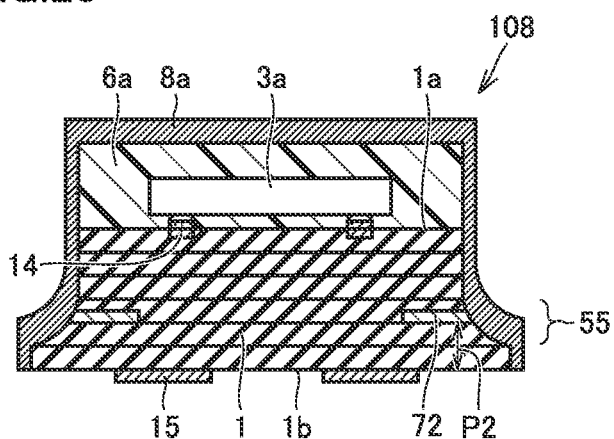
FIG. 26 is a cross-sectional view taken along the line XXVI-XXVI in FIG. 24.

A component according to an eighth embodiment based on the present disclosure will be described with reference to FIGS. 24 to 26. FIG. 24 shows a plan view of a module 108 according to the present embodiment. A right-hand side in FIG. 24 corresponds to first side 81, and an upper side corresponds to second side 82. FIG. 25 shows a cross-sectional view taken along the line XXV-XXV in FIG. 24. FIG. 26 shows a cross-sectional view taken along the line XXVI-XXVI in FIG. 21.

When viewed in a cross section taken along a plane perpendicular to first surface 1*a*, i.e., when viewed in FIG. 25 or 26, inclined portion 55 is formed in substrate 1. In the present embodiment, as shown in FIG. 25, inclined portion 55 is formed at a lower end of a side surface of substrate 1 along first side 81. However, in the present embodiment, as shown in FIG. 26, a perpendicular side surface exists below inclined portion 55 along second side 82. First lead electrode 71 and second lead electrode 72 are exposed to inclined portion 55.

The present embodiment can also provide the effect described in the seventh embodiment.

Ninth Embodiment

Although the inclined portion has been described as having a curved surface in each of the above-described embodiments, the present disclosure is not limited thereto. The inclined portion may have, for example, a flat surface.

Figure 27:
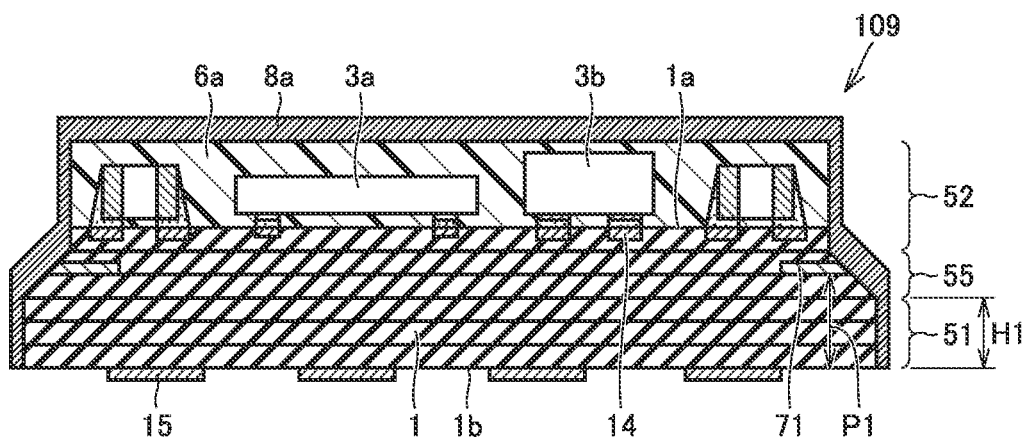
FIG. 27 is a cross-sectional view of a module according to a ninth embodiment based on the present disclosure.

A module according to a ninth embodiment based on the present disclosure will be described with reference to FIGS. 27 to 28. FIG. 27 shows a cross-sectional view of a module 109 according to the present embodiment.

In this cross-sectional view, inclined portion 55 is indicated by a combination of straight lines, not the R shape. That is, inclined portion 55 has a sloping surface, not the curved surface. Such a shape may be applied. The remaining configuration is the same as that of the first embodiment.

Figure 28:
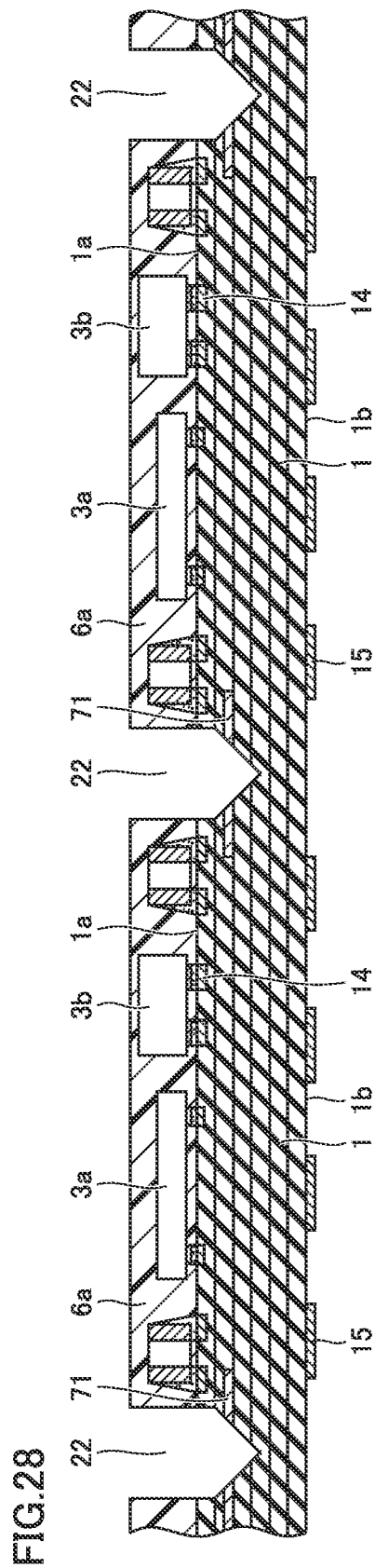
FIG. 28 is an illustrative view of a method for manufacturing the module according to the ninth embodiment based on the present disclosure.

In order to obtain module 109 according to the present embodiment, a groove 22 may be formed as shown in FIG. 28, when a groove is formed along a boundary line of each module, for example. A tip of groove 22 has a V shape. In order to form such groove 22, a dicing machine including a blade having a V-shaped tip may be appropriately selected.

The present embodiment can also provide the effect described in the first embodiment.

A plurality of the above-described embodiments may be combined as appropriate.

The embodiments disclosed herein are illustrative and non-restrictive in every respect. The scope of the present disclosure is defined by the terms of the claims and is intended to include any modifications within the scope and meaning equivalent to the terms of the claims.

1 substrate; 1*a* first surface; 1*b* second surface; 3*a*, 3*b*, 3*c*, 3*d*, 3*e* component; 6*a* first sealing resin; 6*b* second sealing resin; 8 shield film; 8*a* first shield film; 8*b* second shield film; 10 base member; 10*a* first surface (of base member); 10*b* second surface (of base member); 14, 15 pad electrode; 16 columnar electrode; 20, 22 groove; 21 break; 51 first portion; 52 second portion; 53 third portion; 55 inclined portion; 57 first inclined portion; 58 second inclined portion; 71 first lead electrode; 72 second lead electrode; 81 first side; 82 second side; 101, 102, 103, 104, 105, 107, 108, 109 module; 106 component.

The invention claimed is:

1. A module comprising:
a substrate including a first surface and including first and second sides;
a first component mounted on the first surface;
a first sealing resin arranged to cover the first surface and the first component; and
a first shield film covering upper and side surfaces of the first sealing resin and at least a part of a side surface of the substrate, wherein
when viewed in a cross section taken along a plane perpendicular to the first surface, an inclined portion is provided in the substrate,
the substrate includes a first lead electrode arranged to be exposed to the inclined portion along the first side, and a second lead electrode arranged to be exposed to the inclined portion along the second side,
each of the first lead electrode and the second lead electrode is connected to the first shield film,
a position of the inclined portion in a height direction along the second side is different from a position of the inclined portion in a height direction along the first side,
the first side and the second side are perpendicular to each other in a plan view,
each of the first lead electrode and the second lead electrode has a film shape parallel to the first surface, and
no via conductor connecting to each of the first lead electrode and the second lead electrode is exposed to the inclined portion.

2. The module according to claim 1, wherein
when viewed in the cross section, the inclined portion has a downward convex curved shape.

3. The module according to claim 2, wherein
at least one of the first lead electrode and the second lead electrode is exposed to a lower end of the inclined portion.

4. The module according to claim 1, wherein
the substrate includes a second surface as a surface opposite to the first surface, and a second component is mounted on the second surface.

5. The module according to claim 4, further comprising
a second sealing resin arranged to cover the second surface and the second component, wherein
the first shield film further covers a side surface of the second sealing resin.

6. A module comprising:
a substrate including a first surface and a second surface facing opposite to the first surface, and including first and second sides;
a first component mounted on the first surface;
a first sealing resin arranged to cover the first surface and the first component;
a first shield film covering upper and side surfaces of the first sealing resin and a part of a side surface of the substrate;
a second sealing resin arranged to cover the second surface; and
a second shield film covering another part of the side surface of the substrate, wherein
when viewed in a cross section taken along a plane perpendicular to the first surface, the substrate includes a first inclined portion provided on an area of the substrate closer to the first surface and a second inclined portion provided on an area of the substrate closer to the second surface, the substrate includes a first lead electrode arranged to be exposed to the first inclined portion along the first side, and a second lead electrode arranged to be exposed to the second inclined portion along the second side, the first shield film covers the first inclined portion, the first lead electrode is connected to the first shield film, the second shield film covers the second inclined portion, the second lead electrode is connected to the second shield film, a position of the first inclined portion in a height direction along the second side is different from a position of the first inclined portion in a height direction along the first side, the first side and the second side are perpendicular to each other in a plan view, and each of the first lead electrode and the second lead electrode has a film shape parallel to the first surface, and no via conductor connecting to each of the first lead electrode and the second lead electrode is exposed to the inclined portion.

7. The module according to claim 6, wherein the first shield film and the second shield film are spaced apart from each other.

8. A component comprising:

a base member including a first surface and including first and second sides; and a shield film covering at least a side surface of the base member, wherein when viewed in a cross section taken along a plane perpendicular to the first surface, an inclined portion is provided, the base member includes a first lead electrode arranged to be exposed to the inclined portion along the first side, and a second lead electrode arranged to be exposed to the inclined portion along the second side, each of the first lead electrode and the second lead electrode is connected to the shield film, a position of the inclined portion in a height direction along the second side is different from a position of the inclined portion in a height direction along the first side, the first side and the second side are perpendicular to each other in a plan view, each of the first lead electrode and the second lead electrode has a film shape parallel to the first surface, and no via conductor connecting to each of the first lead electrode and the second lead electrode is exposed to the inclined portion.

9. The module according to claim 2 wherein the substrate includes a second surface as a surface opposite to the first surface, and a second component is mounted on the second surface.

10. The module according to claim 3, wherein the substrate includes a second surface as a surface opposite to the first surface, and a second component is mounted on the second surface.

* * * * *